(12) United States Patent
Chase

(10) Patent No.: US 11,164,551 B2
(45) Date of Patent: Nov. 2, 2021

(54) AMPLIFIER MATCHING IN A DIGITAL AMPLIFIER MODELING SYSTEM

(71) Applicant: Clifford W. Chase, Plaistow, NH (US)

(72) Inventor: Clifford W. Chase, Plaistow, NH (US)

( * ) Notice: Subject to any disclaimer, the term of this patent is extended or adjusted under 35 U.S.C. 154(b) by 0 days.

(21) Appl. No.: 16/800,031

(22) Filed: Feb. 25, 2020

(65) Prior Publication Data
US 2020/0279546 A1 Sep. 3, 2020

Related U.S. Application Data

(60) Provisional application No. 62/811,811, filed on Feb. 28, 2019.

(51) Int. Cl.
*G10H 3/18* (2006.01)
*H03F 3/181* (2006.01)
*H03F 1/32* (2006.01)

(52) U.S. Cl.
CPC ............ *G10H 3/187* (2013.01); *H03F 1/327* (2013.01); *H03F 3/181* (2013.01); *G10H 2210/311* (2013.01); *G10H 2250/061* (2013.01)

(58) Field of Classification Search
CPC ............ G10H 3/187; G10H 2210/311; G10H 2250/061; H03F 1/327; H03F 3/181
USPC .......................................................... 84/603
See application file for complete search history.

(56) References Cited

U.S. PATENT DOCUMENTS

| | | | | |
|---|---|---|---|---|
| 4,482,866 A | * | 11/1984 | Crooks | ..................... H04R 3/04 |
| | | | | 330/105 |
| 4,523,152 A | * | 6/1985 | Garde | ................... H03F 3/2171 |
| | | | | 330/151 |
| 4,638,258 A | * | 1/1987 | Crooks | ................... H03G 5/165 |
| | | | | 330/149 |
| 5,789,689 A | * | 8/1998 | Doidic | .................... G10H 1/125 |
| | | | | 341/138 |
| 5,968,194 A | | 10/1999 | Wu et al. | |
| 6,055,661 A | | 4/2000 | Luk | |
| 6,068,489 A | * | 5/2000 | Nagata | .................... G10H 1/365 |
| | | | | 434/307 A |

(Continued)

FOREIGN PATENT DOCUMENTS

EP 1879292 A1 1/2008

OTHER PUBLICATIONS

Chase, "Multipoint Iterative Matching & Impedance Correction Technology (MIMIC TM)", Fractal Audio Systems, Apr. 2013, pp. 1-10, Plaistow, NH.

(Continued)

*Primary Examiner* — Christina M Schreiber
(74) *Attorney, Agent, or Firm* — Spectrum IP Law Group LLC

(57) ABSTRACT

In one example, a method to match a digital amplifier model to a real guitar amplifier comprises obtaining an amplifier output filter and an amplifier input filter for the real guitar amplifier, using the amplifier output filter and a model output filter to obtain a corrective output filter, using the amplifier input filter and a model input filter to obtain a corrective input filter, and applying the corrective input filter and the corrective output filter to the digital amplifier model. The amplifier output filter and the amplifier input filter can be obtained using exponential sine sweep (ESS) and a matched filter. Other examples and related methods and apparatuses are also disclosed herein.

14 Claims, 5 Drawing Sheets

(56) References Cited

U.S. PATENT DOCUMENTS

| | | | |
|---|---|---|---|
| 6,504,427 B2* | 1/2003 | Midya | H03F 3/2175 330/10 |
| 6,504,935 B1* | 1/2003 | Jackson | G10H 1/125 381/61 |
| 6,577,150 B1 | 6/2003 | Nishimura | |
| 6,675,328 B1 | 1/2004 | Krishnamachari et al. | |
| 6,691,077 B1 | 2/2004 | Burns et al. | |
| 6,881,891 B1* | 4/2005 | Limacher | G10H 1/16 84/662 |
| 6,881,892 B2* | 4/2005 | Miyazaki | G10H 1/125 84/603 |
| 6,998,528 B1 | 2/2006 | Limacher et al. | |
| 8,098,830 B2 | 1/2012 | Coker et al. | |
| 8,525,710 B1* | 9/2013 | Tsang | H03F 3/45968 341/118 |
| 8,796,530 B2 | 8/2014 | Kemper | |
| 8,964,998 B1* | 2/2015 | McClain | H03G 3/32 381/57 |
| D738,349 S | 9/2015 | Kemper | |
| 9,136,798 B2* | 9/2015 | Moon | H03F 3/185 |
| 10,218,320 B1* | 2/2019 | Chen | H03F 1/04 |
| 2002/0097090 A1* | 7/2002 | Smedegaard-Pedersen | H03F 1/3229 330/251 |
| 2002/0143486 A1 | 10/2002 | Jain et al. | |
| 2005/0243906 A1 | 11/2005 | Awaji et al. | |
| 2006/0203830 A1 | 9/2006 | Doi | |
| 2007/0043548 A1 | 2/2007 | Arevalo et al. | |
| 2007/0071249 A1 | 3/2007 | Reining et al. | |
| 2008/0127009 A1 | 5/2008 | Veneris et al. | |
| 2008/0134867 A1 | 6/2008 | Kemper | |
| 2009/0138760 A1 | 5/2009 | Moreira et al. | |
| 2010/0037190 A1 | 2/2010 | Wong | |
| 2010/0114520 A1 | 5/2010 | Furukawa et al. | |
| 2010/0321033 A1* | 12/2010 | Gasseling | G01R 31/2822 324/601 |
| 2011/0069745 A1 | 3/2011 | Thompson et al. | |
| 2012/0154032 A1* | 6/2012 | Lesso | H03K 3/013 330/109 |
| 2012/0195441 A1* | 8/2012 | Moon | H03F 3/217 381/98 |
| 2013/0066582 A1 | 3/2013 | Pelz et al. | |
| 2014/0270215 A1 | 9/2014 | Lin et al. | |
| 2015/0212112 A1 | 7/2015 | Lai et al. | |
| 2015/0249888 A1* | 9/2015 | Bogdanov | H03F 3/181 381/98 |
| 2016/0179458 A1* | 6/2016 | Chase | G10H 1/125 700/94 |
| 2016/0328501 A1* | 11/2016 | Chase | G06F 30/367 |
| 2016/0334466 A1 | 11/2016 | Rivoir | |
| 2017/0006399 A1 | 1/2017 | Maziewski | |
| 2018/0255397 A1* | 9/2018 | Proksa | G05B 11/42 |
| 2020/0153392 A1* | 5/2020 | Miyoshi | H03F 3/181 |
| 2020/0279546 A1* | 9/2020 | Chase | H03F 3/181 |

OTHER PUBLICATIONS

Craven et al., "Practical Adaptive Room and Loudspeaker Equaliser for Hi-Fi Use", AES UK DSP Conference, Sep. 1992, pp. 121-153.
Gardner, "Efficient Convolution without Input-Output Delay", J. Audio Eng. Soc., vol. 43, No. 3, Mar. 1995, pp. 127-136.
Pakarinen et al., "A Review of Digital Techniques for Modeling Vacuum-Tube Guitar Amplifiers", Computer Music Journal, 33:2, pp. 85-100, Summer 2009, Massachusetts Institute of Technology, Boston, MA.
Jaananen et al., "Efficient and high-quality equalization using a multirate filterbank and FIR filters", Audio Engineering Society Convention Paper 7110 presented at the 122nd Convention, May 5-8, 2007, Vienna, Austria, pp. 1-8.

* cited by examiner

AMPLIFIER MATCHING IN A DIGITAL AMPLIFIER MODELING SYSTEM

CROSS-REFERENCE TO RELATED APPLICATIONS

The present application claims the benefit of U.S. Provisional Application No. 62/811,811 filed Feb. 28, 2019. Said Application No. 62/811,811 is hereby incorporated herein by reference in its entirety.

BACKGROUND

Modern digital modeling of tube guitar amplifiers has been nearly perfected. Perceived inaccuracies, however, still exist due to differences between a model of the amplifier and a given sample of the actual amplifier. These differences exist due to a variety of factors: component tolerance, aging and drift, parasitic components due to wiring and layout variation, especially in point-to-point and other hand-wired topologies, variation in speaker impedance, and changes in the amplifier components by the manufacturer during the life-cycle of the product. Indeed, it is not unusual for a manufacturer to change component values due to availability concerns or other reasons, thereby affecting the sound of the amplifier. No two unit samples of a given amplifier are exactly the same.

These variations primarily cause differences in frequency response, and since humans are very sensitive to frequency response, the variations can be perceived by users as inaccuracies or "flaws" in the amplifier model. Furthermore, cognitive bias can only be completely overcome if a user cannot discern between the amplifier and the model in blind A/B tests. Variations in frequency response are easy to identify and, if not eliminated, can cause unwanted outcomes in the A/B testing process.

Modern modeling techniques can create very accurate amplifier models but cannot account for the aforementioned sample differences. Therefore, it would be beneficial to be able to correct an amplifier model so as to more closely match the model to any particular individual sample of the amplifier that has been modeled, for example by obtaining corrective equalization and corrective system gain.

DESCRIPTION OF THE DRAWING FIGURES

Claimed subject matter is particularly pointed out and distinctly claimed in the concluding portion of the specification. However, such subject matter may be understood by reference to the following detailed description when read with the accompanying drawings in which:

Figure 1:
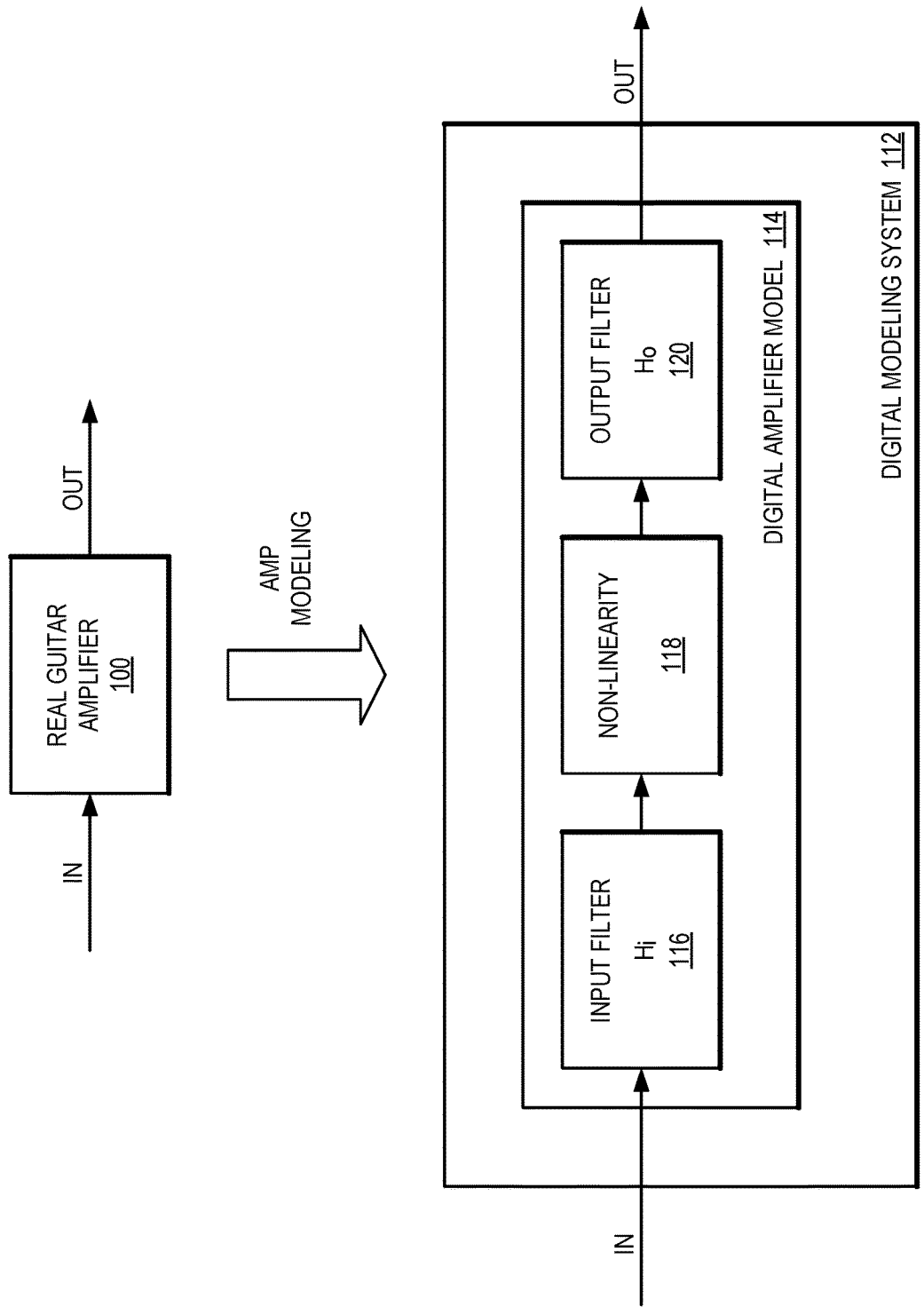
FIG. 1 is a diagram of a digital amplifier model that represents the response of a real guitar amplifier in accordance with one or more embodiments.

It will be appreciated that for simplicity and/or clarity of illustration, elements illustrated in the figures have not necessarily been drawn to scale. For example, the dimensions of some of the elements may be exaggerated relative to other elements for clarity. Further, if considered appropriate, reference numerals have been repeated among the figures to indicate corresponding and/or analogous elements.

DETAILED DESCRIPTION

In the following detailed description, numerous specific details are set forth to provide a thorough understanding of claimed subject matter. It will, however, be understood by those skilled in the art that claimed subject matter may be practiced without these specific details. In other instances, well-known methods, procedures, components and/or circuits have not been described in detail.

In the following description and/or claims, the terms coupled and/or connected, along with their derivatives, may be used. In particular embodiments, connected may be used to indicate that two or more elements are in direct physical and/or electrical contact with each other. Coupled may mean that two or more elements are in direct physical and/or electrical contact. However, coupled may also mean that two or more elements may not be in direct contact with each other, but yet may still cooperate and/or interact with each other. For example, "coupled" may mean that two or more elements do not contact each other but are indirectly joined together via another element or intermediate elements. Finally, the terms "on," "overlying," and "over" may be used in the following description and claims. "On," "overlying," and "over" may be used to indicate that two or more elements are in direct physical contact with each other. It should be noted, however, that "over" may also mean that two or more elements are not in direct contact with each other. For example, "over" may mean that one element is above another element but not contact each other and may have another element or elements in between the two elements. Furthermore, the term "and/or" may mean "and", it may mean "or", it may mean "exclusive-or", it may mean "one", it may mean "some, but not all", it may mean "neither", and/or it may mean "both", although the scope of claimed subject matter is not limited in this respect. In the following description and/or claims, the terms "comprise" and "include," along with their derivatives, may be used and are intended as synonyms for each other.

Referring now to FIG. 1, a diagram of a digital amplifier model that represents the response of a real guitar amplifier in accordance with one or more embodiments will be discussed. As shown in FIG. 1, a real guitar amplifier 100 can be represented by a canonical model in a digital modeling system 112 as a digital amplifier model 114. The digital amplifier model 114 can be comprised of two linear filters, an input filter 116 and an output filter 120, separated by a nonlinearity 118. In some examples, the nonlinearity 118 generally can be considered as a sigmoid having a mathematical function resembling, for example, y=a tan(x) or y=tan h(x). In the real guitar amplifier 100 and its digital amplifier model 114, the actual function can be far more complex than these example mathematical functions, but still performs a clipping function. It should be noted that although a real guitar amplifier 100 and its digital amplifier model 114 are discussed herein for purposes of example, other types of amplifier may be utilized, for example bass guitar amplifiers, or any type of amplifier that has a non-linearity 118 to allow for the determination of its output filter 120 and its input filter 116 using the techniques described herein, and the scope of disclosed subject matter is not limited in this respect.

In FIG. 1, $H_i$ represents the transfer function of input filter 116, and $H_o$ represents the transfer function of output filter 120. In some examples, the output filter 120 optionally can represent the output transfer function of real guitar amplifier 100 with or without including the transfer function of a loudspeaker connected to real guitar amplifier 100. In any case, output filter 120 can comprise all filtering after the nonlinearity.

The aforementioned variations in individual real guitar amplifiers can affect both input filter 116 and output filter 120 as well as the overall system gain of the amplifier. In order to correct the digital amplifier model 114 to accommodate the variations and to more closely match specific individual real guitar amplifier, input filter 116, output filter 120, and the system gain of the digital amplifier 114 can be corrected as discussed herein.

Figure 2:
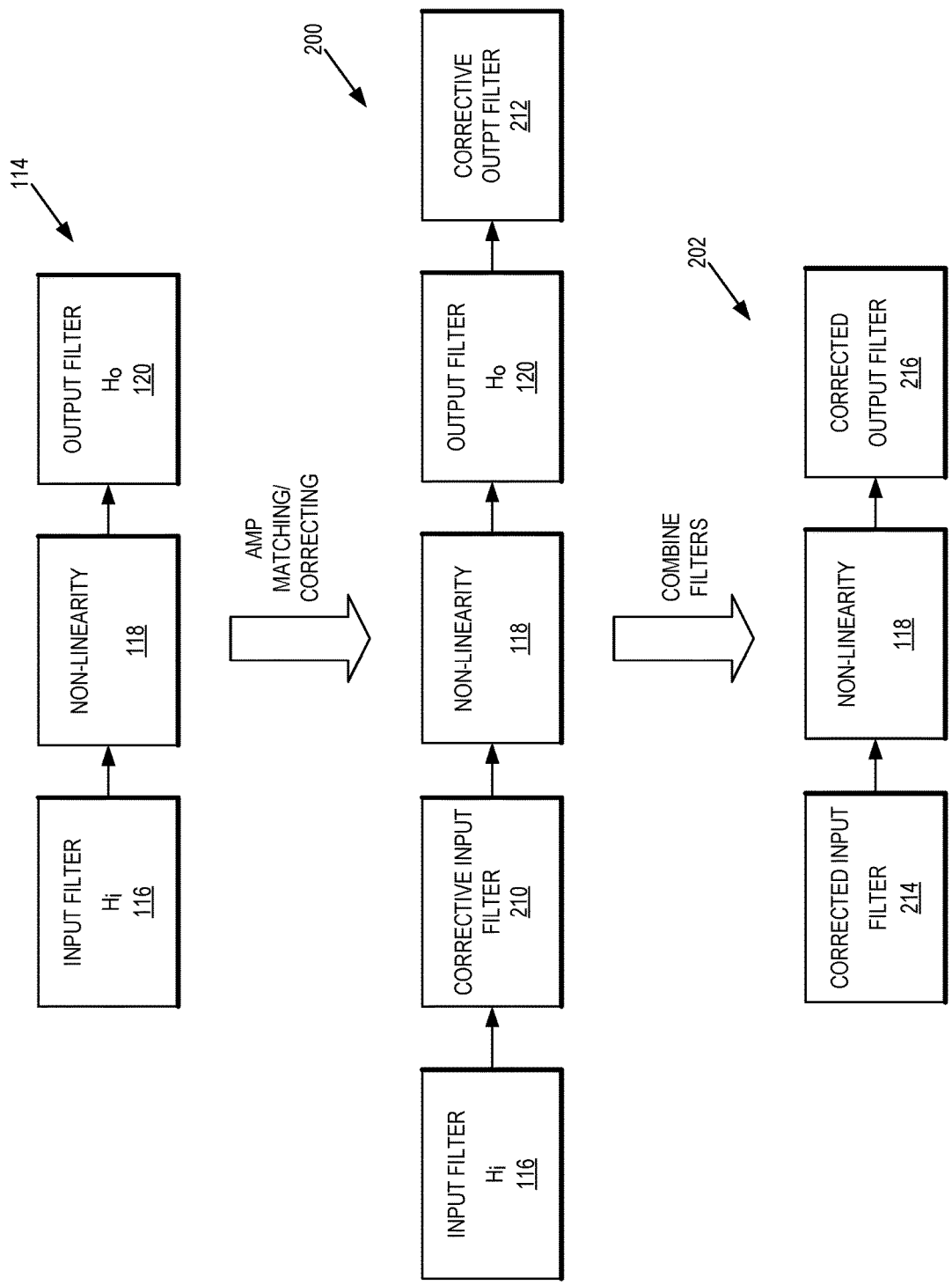
FIG. 2 is a diagram of a digital amplifier model that includes one or more corrective filters to correct the digital amplifier model to match a specific individual real guitar amplifier in accordance with one or more embodiments.

Referring now to FIG. 2, a diagram of a digital amplifier model that includes one or more corrective filters to correct the digital amplifier model to match a specific individual real guitar amplifier in accordance with one or more embodiments will be discussed. The digital amplifier model 114 as shown in FIG. 1 can be corrected or adjusted to more closely match the specific individual real guitar amplifier in a process that can be referred to as amp matching or amp correcting. The result of the amp matching process is a corrected digital amplifier model 200. It should be noted that the term match, corrected, or corrective, can mean that the corrected digital amplifier model 200 can more closely resemble or approximate the specific real guitar amplifier 100, and that being identical, or being an absolute match, is not required. Thus, in some examples, match can mean an that the corrected digital amplifier model 200 is an identical match to the specific real guitar amplifier 100, or match can mean that the corrected digital amplifier model 200 is a close but not identical match. In some examples, match can mean that the corrected digital amplifier model 200 resembles the specific real guitar amplifier 100 to the user. In yet other examples, the term match can mean that a user can recognize that the corrected digital amplifier model 200 sounds more like the specific real guitar amplifier 100 than the uncorrected digital amplifier model 114. It should be noted that these are merely examples of how the term match, and similarly the terms corrected and corrective, can be applied in the present context, and the scope of the disclosed subject matter and the scope of the claimed subject matter is not limited in these respects.

The corrected digital amplifier model 200 can include a corrective input filter 210 to correct or adjust the response of input filter 116, or a corrective output filter 212 to correct or adjust the response of output filter 120, or both. In addition, any changes in the overall system gain of the digital model to match the overall system gain of the individual real amplifier can be achieved via the gain of corrective input filter 210 or the gain of corrective output filter 212, or both. In some examples, the corrective input filter 210 can be combined with input filter 214 to provide corrected input filter 214, and output filter 212 can be combined with output filter 120 to arrive a corrected digital amplifier model 202 with combined filters.

In order to correct the filters of the digital amplifier model 114, the input filter transfer function ($H_i$) and the output transfer function ($H_o$) of both the individual real guitar amplifier 199 and the digital amplifier model 114 of the amplifier should be determined. It can be impractical to measure $H_i$ and $H_o$ of the amplifier directly as this can involve disassembly of the amplifier and obtaining complex measurements. Instead, the real guitar amplifier 100 can be treated as a "black box" using analytic signals in which an observation of the output is obtained for a given input to the black box. In a linear system with two filters in series, the black box approach normally would be impossible using analytic signals since linear systems are associative and commutative. In other words, if a sine wave of unit amplitude is applied to the input of the black box and the output is measured to be y, there are infinite combinations of two filters that when convolved produce the output y.

The nonlinearity of the system comprising non-linearity 118, however, can be exploited to obtain input filter 116 and output filter 120. This can be accomplished by applying a sine wave of sufficient amplitude so as to drive the nonlinearity into clipping over the frequency range of interest to yield data that can be manipulated to extract the filters. Using this approach is possible because the nonlinearity effectively "whitens" the spectrum by normalizing all frequencies to the same amplitude. A variety of techniques including stepped and continuous frequency sweeps can be used for this process.

The output filter (Ho) of the system can be found as follows. The frequency response can be obtained at a single frequency by applying a sine wave of sufficient amplitude such that its non-linearity 118 will create a clipped sine wave. The output of the nonlinearity will therefore be a harmonic series, also known as a Fourier series, of sine waves. The magnitude of the fundamental frequency will be a constant value regardless of frequency. The output of the system at the applied frequency will therefore be entirely dependent upon the response of output filter 120.

If a sine wave sufficient in amplitude is applied to the input of the system to cause clipping was described above, the output transfer function can be determined by simply measuring the amplitude, and optionally the phase, at the applied frequency and ignoring the harmonics. In some examples, this can be accomplished by stepping the sine wave frequency or applying a swept sine or other modulated waveform over a range of input signal frequencies and isolating the fundamental frequency in the output signal with a tracking filter or by performing a fast Fourier transform (FFT) analysis. Performing this measurement over a range of input frequencies will provide the output filter 120.

Once the output filter 120 is found as described above, the input filter 116 can be found. Reducing the amplitude of the input signal sufficiently below the level of clipping for non-linearity 118, assuming a sigmoid transfer function, will essentially create a linear system. The transfer function of the linear system can then be easily measured by any number of techniques including the same techniques described above, for example using the stepped or continuous swept sine wave inputs. The difference is that the level of the input sine wave does not result in clipping of non-linearity. Since the output filter 120 has already been obtained, it is a simple matter to obtain the input filter 116. By measuring the output of the system using a low level input sine wave, the measured transfer function $H_t$ of the overall system is the product of the input filter 116 and the output filter, $H_t = H_i \cdot H_o$. Therefore, the input filter 116 is simply $H_i = H_t / H_o$.

Once the input and output filters have been found, the digital amplifier model 114 can be corrected. By applying the same analysis to the digital amplifier model 114, either a priori, at the same time or after, the equivalent input and output filters of the model can be determined. Corrective filters such as corrective input filter 210 or corrective input filter 212 can then be determined to correct the frequency response deviations of the input filter 210 and output filter 120 of the digital amplifier model 114.

If we let $H_{oa}$ be the output filter of the real guitar amplifier 110 and $H_{om}$ be the output filter of the digital amplifier model 114, then the corrective output filter 212 is simply $H_{oa}/H_{om}$. The same process is then applied to the input filters of the guitar amplifier and the digital amplifier model. A convenient side effect of this result is that the gain adjustment provided by corrective input filter 210 also corrects any gain differences between the real guitar amplifier 100 and the digital amplifier model 114. This gain adjustment can be extracted by normalizing the corrective input filter 210, or the filter can be left as-is.

In some cases, the corrected input filter 210 and the corrected output filter 212 can be determined at the time the digital amplifier model 114 is obtained and stored as model data in the amplifier modeling software of digital modeling system 112. Indeed, many common modeling approaches involve creating and storing input and output equalization as part of the modeling process. In such cases, there is no need to apply the stimulus to the digital amplifier model 114 itself. The input and output filters derived from the real guitar amplifier 100 can then be used along with the stored filter data to obtain the corrective filters. The corrective filters can then be applied separately, for example as shown in FIG. 2 by corrected digital amplifier model 200, or the corrective filters can be combined with the stored filters to obtain new input and output filters for the model, for example as corrected input filter 214 and corrected output filter 216 of corrected digital amplifier model 202.

Figure 3:
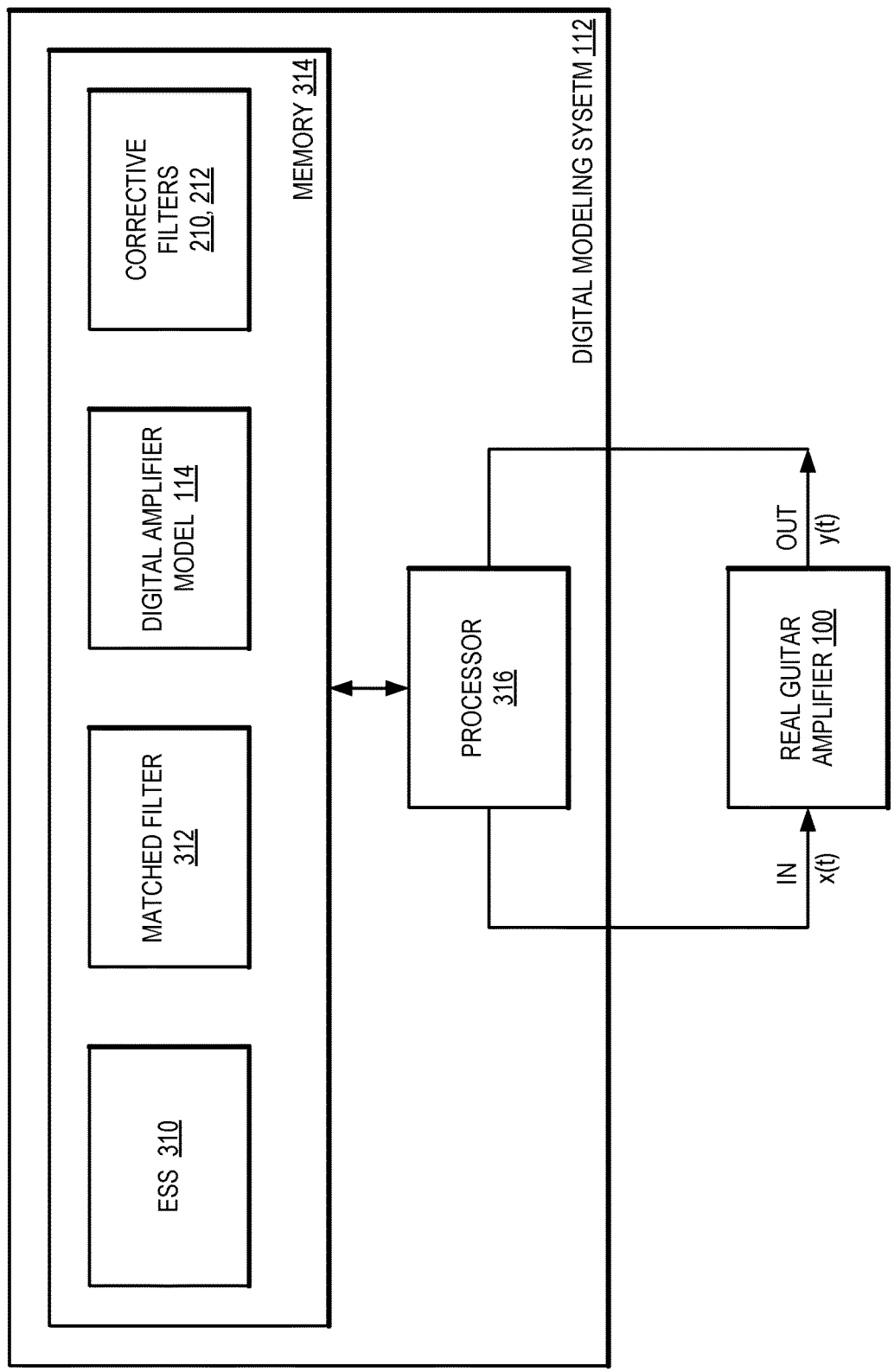
FIG. 3 is a diagram of a digital amplifier modeling system that utilizes an exponential sine sweep (ESS) and a corresponding matched filter to correct a response of digital amplifier model to match the response of an individual real guitar amplifier in accordance with one or more embodiments.

Referring now to FIG. 3, a diagram of a digital amplifier modeling system that utilizes an exponential sine sweep (ESS) and a corresponding matched filter to correct a response of digital amplifier model to match the response of an individual real guitar amplifier in accordance with one or more embodiments will be discussed.

Using stepped or continuous frequency sweeps can be tedious and time-consuming and can also stress the amplifier being measured, real guitar amplifier 100. In either case, a tracking filter or fast Fourier transform (FFT) analysis can be used to filter out the fundamental from the harmonics. In some examples, the measurement process can be performed as fast as possible to prevent any undue stress on the real guitar amplifier 100. Applying high amplitude sine waves to the real guitar amplifier 100 for long periods of time can cause costly damage to the components including the transformers or one or more speakers connected to the output of the real guitar amplifier 100.

In accordance with one or more embodiments, a stimulus waveform can be applied to the input of the real guitar amplifier 100 or a digital amplifier model 114 that allows extraction of the output filter response of the real guitar amplifier 100 or the digital amplifier model 114 without the using tracking filters or a long duration stimulus. In a linear system, the transfer function, or impulse response, of the system can be found using a variety of stimulus waveforms, for example an impulse function such as the Dirac delta function, maximal-length sequences (MLS), pseudo-random noise (PN), or sine sweeps.

While an impulse function can be used to obtain the transfer function of a system, in practice it is impractical due to the poor signal-to-noise ratio (SNR) obtained and/or the high instantaneous power level required to realize the function. Any waveform that contains a sufficiently broad power spectrum, meaning it has power at all frequencies of interest, can be used to obtain the impulse response of the system via deconvolution. One approach is to take the Fourier transform of the stimulus waveform and of the response. The transfer function is then simply the ratio of the response to the stimulus wherein $H(\omega)=Y(\omega)/X(\omega)$. The drawback of this technique, however, is that it does not work with nonlinear systems such as a real guitar amplifier 100 or the digital amplifier model 114. Any nonlinear products in the output response generate errors in the transfer function.

In accordance with one or more embodiments, the transfer function of the real guitar amplifier 100 or the digital amplifier model 114 can be obtained by convolving the response of the real guitar amplifier 100 or the digital amplifier model 114 with a matched filter. Conventional deconvolution finds $H(\omega)$ by dividing the response by the stimulus in the frequency domain (H=Y/X). Alternatively, $H(\omega)$ can be found via $H(\omega)=Y(\omega) \cdot F(\omega)$ where $F(\omega)$ is a matched filter. If we know $X(\omega)$, which can be obtained from signal x(t) applied to the input of the real guitar amplifier 100 or the digital amplifier model 114, an appropriate filter can be designed such that the convolution of the output signal y(t) of the real guitar amplifier 100 or the digital amplifier model 114 with the matched filter yields the system response, h(t), of the real guitar amplifier 100 or the digital amplifier model 114. A matched filter has additional utility in that a matched filter can filter out noise. In some examples, the distortion created by non-linearity 118 of a guitar amplifier system as shown in FIG. 1 can be considered a type of noise.

To obtain the transfer function using a stimulus and matched filter, the convolution of the stimulus and filter should be equal to an impulse which means the spectrum must be "white", or flat over the frequency of interest. If $X(\omega)$ is the input spectrum and $F(\omega)$ is the filter spectrum then mathematically this means $X(\omega) \cdot F(\omega)=1$ over the frequency range. In some examples, the stimulus and matched filter combinations can include a sine wave "chirp" and its matched filter. When convolved, the spectrum is white.

In the classic matched filter design, the noise is considered to be additive white Gaussian noise (AWGN) in which case the ideal matched filter is simply the time reversal of the input signal, or $f(t)=x(-t)$. This time reversal of the input signal effectively can create a correlator since convolution time reverses the filter response, wherein: $x(t)*f(t)=\int x(\tau)f(t-\tau)d\tau$.

For a matched filter to be able to obtain the impulse response of a system, the convolution of the stimulus and the filter should create an impulse. This arrangement also implies that the correlation of the stimulus and the filter should be an impulse. There are several waveforms that have this property. In some examples, such waveforms can include sine sweeps.

In accordance with one or more embodiments, the stimulus waveform can comprise an exponential sine sweep (ESS). Exponential sine sweeps are a class of swept sine waves that have unique characteristics that are suitable for being a stimulus to a guitar amplifier system, either real or modeled. The function for an ESS is given by the following equation:

$$x(t) = \sin\left[\omega_0\left(\frac{k^{t/T}-1}{\ln(k^{1/T})}\right)\right] \quad \text{Eq. 1}$$

where k is the ratio of the stop frequency ($\omega_1$) to the start frequency ($\omega_0$) and T is the length of the sweep in seconds, and $\omega=2\pi f$ wherein f is the frequency in Hertz. In some examples when phase is taken into account, $\omega=j2\pi f$ wherein j is an imaginary number such that $j^2=-1$.

It should be noted that the spectrum of an ESS is "pink" in that it decreases at 3 decibels (dB) per octave which resembles the spectra of music. Furthermore, when deconvolved using a matched filter, an ESS allows extraction of the linear portion of the impulse response.

To find the matched filter for an ESS, it is noted that an ESS has a pink spectrum. Therefore, the spectrum of the matched filter should rise at 3 dB per octave. Starting with the classic matched filter $f(t)=x(-t)$, an envelope can be applied to the matched filter that rises at 3 dB per octave. Since the matched filter is the time reversal of the sweep signal, the envelope then decreases in time and is given by the following equation:

$$g(t) = \frac{1}{e^{\frac{t}{T}\ln(kT)}} \quad \text{Eq. 2}$$

In one or more embodiments, the final matched filter then can be $f(t)=x(-t)g(t)$ for an ESS stimulus. Since the spectrum of g(t) rises at 3 dB per octave and the spectrum of x(t) falls at 3 dB per octave, the convolution of the stimulus and the filter is white and yields an impulse in the time domain.

In some embodiments, classic deconvolution techniques can be used instead of using a matched filter, for example wherein the real guitar amplifier 100 is a type of amplifier that does not produce a great amount of distortion even when the non-linearity 118 is driven into its non-linear region. For example, a Fender® Twin Reverb guitar amplifier does not distort much even at high operating levels. Finding the output filter 120 and the input filter 116 can be accomplished using a classic deconvolution which can be more accurate than using a matched filter 312 as the matched filter 312 can introduce errors.

Applying the above to FIG. 3, a digital modeling system 112 can comprise a processor 316 that includes one or more cores or one or more processors comprising a general purpose processor, a digital signal processor (DSP), or both. An ESS stimulus signal 310 can be prestored in memory 314 along with a matched filter 312 for the ESS 310. The memory 314 further can include a digital amplifier model, and memory to store one or more corrective filters 210 and 212 when created by the digital modeling system 112. In some examples, processor 316 can execute instructions stored in or obtained from a machine-readable medium such as memory 314. Memory 314 can include any suitable type of memory or storage such as random-access memory (RAM), flash memory, NOT-AND (NAND) memory, NOT-OR (NOR) memory, or any type of solid-state or chalcogenide or phase-change based memory, and so on, and the scope of the disclosed subject matter is not limited in this respect. Processor 316 can apply the ESS 310 to the input of the real guitar amplifier 100 as the stimulus input signal x(t) per Equation 1 and can measure the resulting output signal y(t) at the output of the real guitar amplifier 100, either directly at the output of the amplifier or after being amplified by a speaker or as applied to a speaker load or other dummy load. The start frequency for the ESS stimulus can be $\omega_0$ and the stop frequency can be $\omega_1$, and the length of the sweep can be T seconds. The output y(t) can then be convolved with the matched filter g(t) from Equation 2 to yield the transfer function h(t) of the real guitar amplifier 100 or of the digital amplifier model 114.

Applying an ESS to a linear system and convolving with the matched filter obtains the transfer function of that system just as would classic deconvolution. If the duration (T) of the ESS is made long compared to the impulse response of the system, an ESS can be used to extract the linear portion of the system response from a nonlinear system.

Applying an ESS with a long duration in comparison to the system's impulse response to a nonlinear system results in a sequence of impulse responses. These impulse response "kernels" are related to the Volterra series expansion and represent impulse responses for the power series of the input comprising $y(t)=h1(t)*x(t)+h2(t)*x2(t)+h3(t)*x3(t)+\ldots$.

The sequence of impulse responses is such that the linear term occurs at a time delay of T (maximum correlation time) and the nonlinear terms prior to that. If the measured response y(t) is convolved with the matched filter f(t) and the impulse response of the system is short in comparison to the stimulus duration, the result is $y(t)*f(t)=h(t-T)$ where T is the duration of the stimulus and h(t) is the impulse response of the linear system after the nonlinearity.

Prior to T the terms h2(t), h3(t), etc. can be found which can be discarded or used to further refine the amp model by correcting the shape of the model's nonlinearity. The position of each impulse response in the time series is a function of the sweep length and the ratio of the stop and start frequencies, k. The time between each kernel is proportional to the sweep length and inversely proportional to k. The various impulse responses can be extracted by simply time windowing the result.

In accordance with one or more embodiments, the ratio of the stop and start frequency for the sweep can be selected to be as low as possible while still covering the range of interest. Lower ratios yield better SNR for the measurement when the non-linearity 118 is driven into clipping. Furthermore, the length of the sweep can be as long as practicably possible. Longer sweeps yield better SNR for the measurement when the non-linearity 118 is driven into clipping. Each doubling of the sweep length increases the SNR of the measurement by approximately 6 dB. For a typical real guitar amplifier 100, a sweep range of 20 Hertz (Hz) to 20 kHz and a sweep length of one second yields an SNR of over 50 dB when the real guitar amplifier 100 is driven into moderate clipping.

Further increases in SNR can be achieved by slightly altering the start and stop frequency of the sweep and averaging several measurements. Such a process decorrelates the measurement noise due to precision effects. Each doubling of the number of measurements with unique start/stop frequencies increases the SNR by 6 dB. This can be more practical in an embedded system than increasing the sweep time as long sweep times necessitate large amounts of storage memory.

In accordance with one or more embodiments, the sweeps can be decorrelated by using a constant ratio of stop/start frequencies and increasing the start frequency slightly for each sweep. Such a process, in effect, creates a spread-spectrum modulation wherein the sample clock frequency is increased for each sweep.

Figure 4:
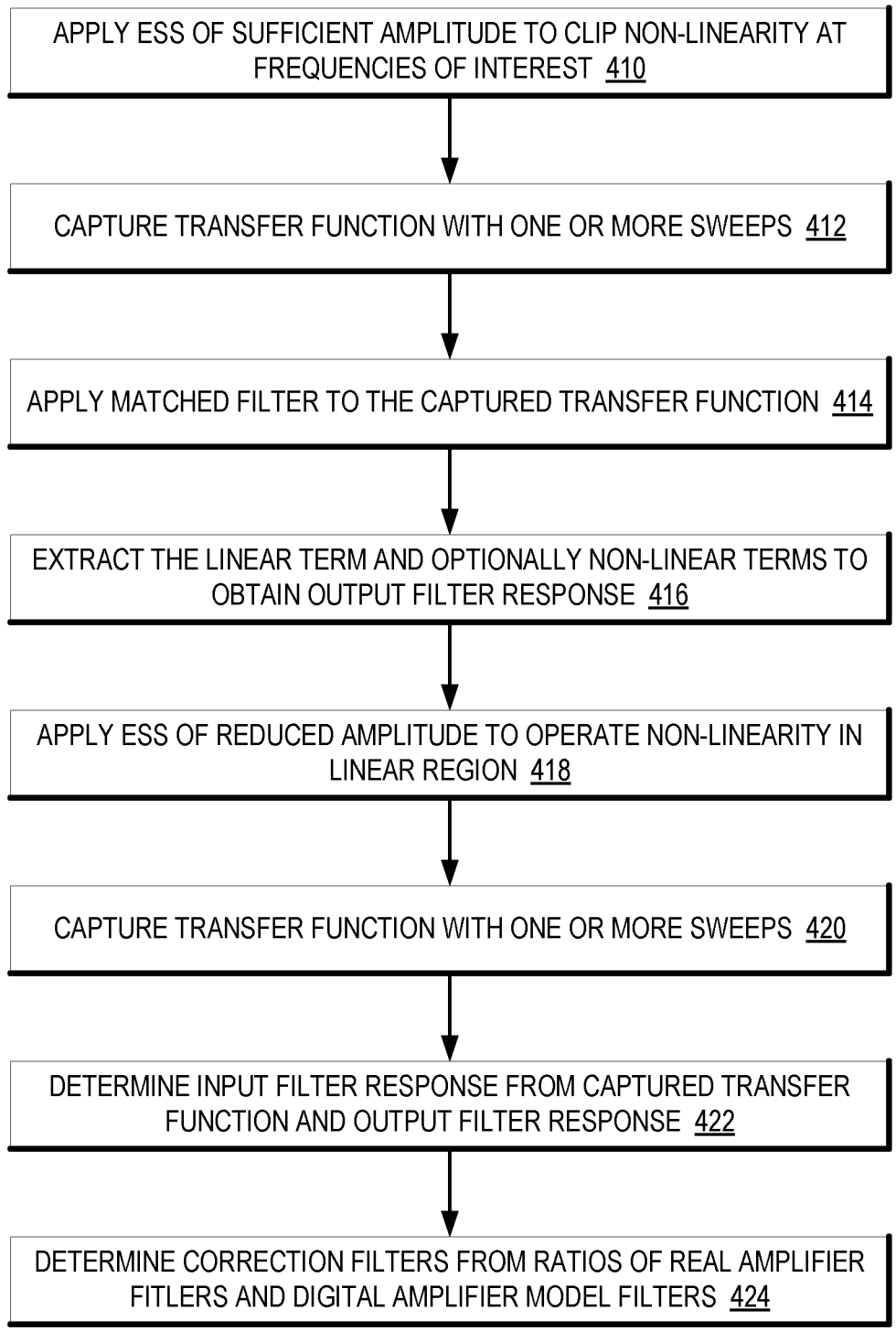
FIG. 4 is a diagram of a method to utilize an exponential sine sweep (ESS) and a corresponding matched filter to obtain input filter and output filter responses of digital amplifier model and a real guitar amplifier and to obtain correction filters in accordance with one or more embodiments.

Referring now to FIG. 4, a diagram of a method to utilize an exponential sine sweep (ESS) and a corresponding matched filter to obtain input filter and output filter responses of digital amplifier model and a real guitar amplifier and to obtain correction filters in accordance with one or more embodiments will be discussed. Method 400 of FIG. 4 can include more or fewer operations than shown or can be provided in various other orders than shown, and the scope of the disclosed subject matter is not limited in these respects. At operation 410, applying an ESS of sufficient amplitude can ensure that the output of the non-linearity 118 is clipped at all frequencies of interest. At operation 412, the transfer function of the output signal can be captured from the output signal using a single sweep or several sweeps that can be averaged to overcome system noise. Since the non-linearity 118 is clipped into its non-linear range, the output of the system is dependent on the output filter response, so the transfer function of the output filter can be obtained from the captured output signal. At operation 414, the matched filter can be applied to the captured output signal. For example, the matched filter can be convolved with the captured output signal. At operation 416, the linear term, and optionally the nonlinear terms, can be extracted after applying the matched filter to obtain the output filter response.

Now that the output filter transfer function has been obtained, the input filter can be obtained in substantially the same or similar way as the output filter was obtained, except that at operation 418 the sweep amplitude of the ESS can be sufficiently reduced to operate the non-linearity 118 block of the amplifier being modeled in its linear region. At operation 420, the transfer function in the linear mode can be captured using one or more sweeps. At operation 422, the input filter response can be determined from the transfer function captured at operation 420 and the output filter response obtained at operation 416 by applying straightforward frequency domain math to generate the input filter transfer function.

At operation 424, the correction filters can be determined from the ratios of the real amplifier filters and the digital amplifier model filters. As discussed herein above, applying the same stimulus to the digital amplifier model 114, either a priori, simultaneously, or a posteriori, can produce corresponding input and output transfer functions which can then be compared to the input and output transfer functions obtained from the real guitar amplifier 100 to create corrective filters. In many cases the input and output filters for the digital amplifier model 114 can be stored as data when the model is created, so performing method 400 for the digital amplifier model 114 can be unnecessary. The stored filter data can then be used to obtain corrective input filter 210 and corrective output filter 212 as shown in FIG. 2. The output corrective filter 212 normally can include the speaker cabinet simulation, also known as the speaker Impulse Response (IR). The corrective input filter 210 can then be used directly or transformed into an equivalent infinite impulse response (IIR) filter, typically comprising a cascade of second-order sections, for example Prony's method.

In some embodiments, when the non-linearity 118 cannot be driven into clipping over the full frequency range of interest, or not at all, the non-linearity 118 can effectively be considered inconsequential at those frequencies. In this case, the input filter response at those frequencies is unity, and the output filter completely describes the response. Applying a real stimulus to the device under test (D.U.T.), namely an electric guitar, in such a case would not generate any distortion at those frequencies. As a result, the system can be considered linear at those frequencies.

In some examples, the intensity of the stimulus level to drive the non-linearity 118 into clipping can be chosen to be as low as possible. This can be achieved by performing multiple sweeps starting at a low level, increasing each sweep in level, and comparing the result to the previous result. When the difference between the results is within some small margin of error, the process can be stopped. This process can perform two functions. The first function is to reduce stress on the real guitar amplifier 100 being tested. The second function is to reduce error in the deconvolution since the more the stimulus signal is distorted the more error is generated in the deconvolution due to finite precision effects. In some examples, a root-mean-square (RMS) comparison of the resulting impulse response or frequency domain magnitude can be used.

Figure 5:
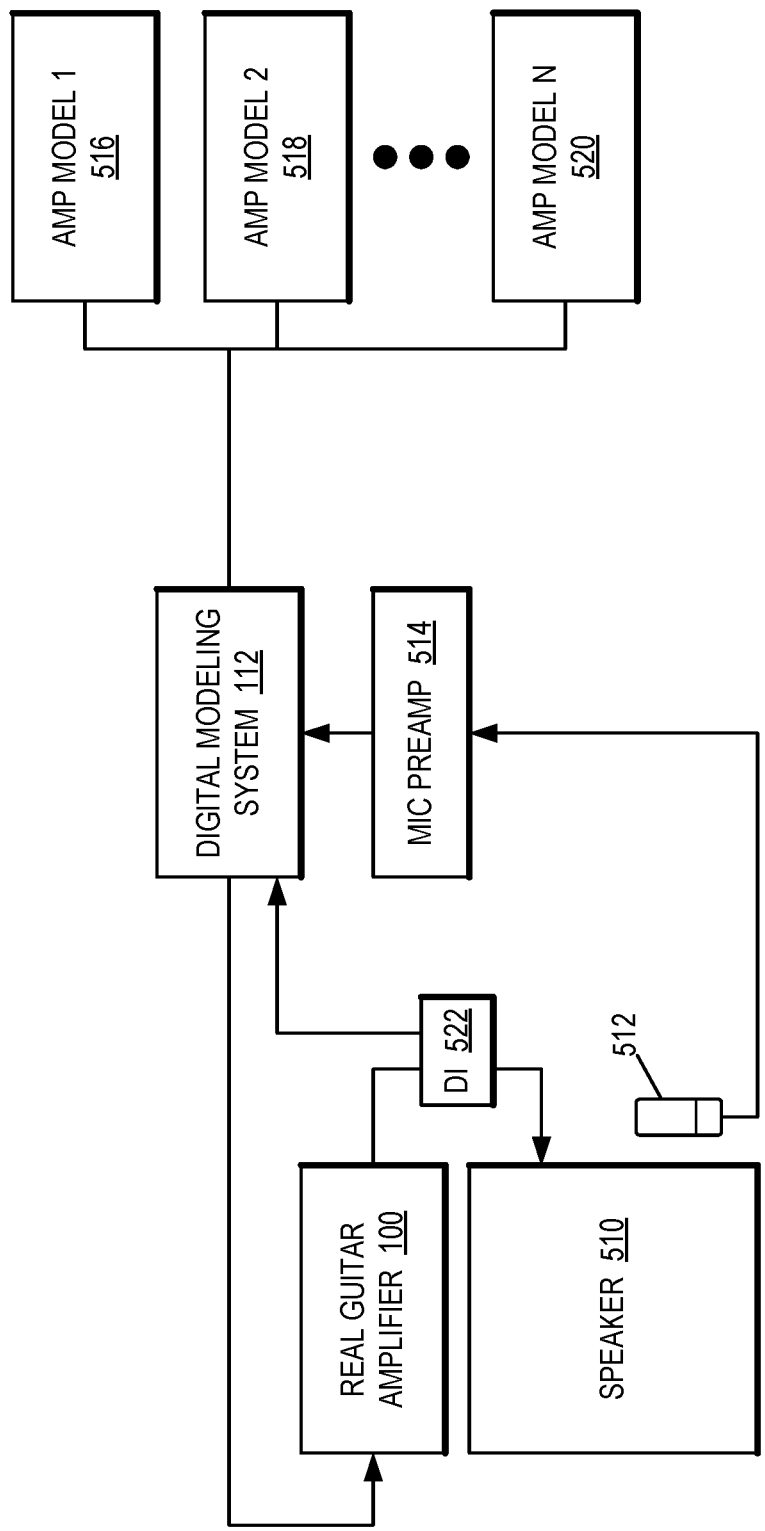
FIG. 5 is a diagram of a process to perform amplifier matching on a real guitar amplifier using a digital modeling system in accordance with one or more embodiments.

Referring now to FIG. 5, a diagram of a process to perform amplifier matching on a real guitar amplifier using a digital modeling system in accordance with one or more embodiments will be discussed. In some examples, the input filter 116 and the output filter 120 of one or more digital amplifier models 114 can already be stored as amp model data in in the digital modeling system 112 as the input filter and output filter for each amp model is an integral part of the modeling process when the amp model is created or obtained. In some examples, digital modeling system 112 can store a first amp model (AMP MODEL 1) 516, a second amp model (AMP MODEL 2) 518, up to an Nth amp model (AMP MODEL N) 520. Each of the amp model can represent a specific manufacturer and model of amplifier using the format of a digital amplifier model 114 as shown in FIG. 1 and can be originally created from representative example guitar amplifiers or based on circuit simulation software such as Simulation Program with Integrated Circuit Emphasis (SPICE) that is capable of providing vacuum tube or valve component simulation, or a combination thereof. The ESS stimulus waveforms, for example ESS 310 as shown in FIG. 3, can be applied to the device under test (D.U.T.) comprising a specific real guitar amplifier 100 to obtain the input filter 116 and the output filter 120 of the real guitar amplifier 100. The filters obtained from the real guitar amplifier 100 can then be used to obtain corrective filters such as corrective input filter 210 and corrective output filter 212 for one or more of the amplifier models 516, 518, or 520. In some examples, the corrective filters can be combined into the filters of the selected amp model as corrected input filter 214 and corrected output filter 216, for example to save processing overhead.

In some examples, the convolution of the measured response with the matched filter as discussed herein can be performed using fast Fourier transform (FFT) processing techniques. The FFT of the matched filter 312 can be pre-calculated and stored in memory 314 as shown in FIG. 3 for use by the convolution process.

In some examples, the amp matching, or correcting, process can be a semi-automated process that can be performed by the user so as to match the selected amp model in the digital modeling system 112 to a particular sample of a real guitar amplifier 100. The user can invoke a software utility or "Wizard" in the digital modeling system 112 that guides the user through the process by instructing the user how to connect the digital modeling system to the real guitar amplifier 100 and then instructing the user to select an amp model that most closely resembles the real guitar amplifier 100. For example, if the real guitar amplifier 100 is a 1965 Fender® Twin Reverb, the user can select the amp model called "65 Double Reverb" as a basis for the amp matching algorithm. The resulting correction filters can be used to correct the filters of the 65 Double Reverb amp model so that the amp model stored in the digital modeling system can be corrected or otherwise updated to match or more closely match the particular real guitar amplifier 100.

As another example, an artist such a Brian Setzer can own a unique 1963 Blonde Bassman amplifier that may be slightly different than a standard Bassman due to uniqueness in the circuit design, aging of the components, and/or a particular selection of amplifier tubes or valves that contribute to the Brian Setzer amplifier sounding different than a stock sample of a Bassman. For example, Brian Setzer's particular amplifier can have the 6G6-B circuit whereas the stock Bassman model can have a different circuit. As a result, the Brian Setzer owned amplifier can sound slightly different than the standard Bassman amp model stored in the digital modeling system 112. The process described herein and shown in FIG. 5 can be applied to Brian Setzer's real guitar amplifier 100 to obtain the correction filters to match the standard Fender® Bassman amp model to Brian Setzer's real guitar amplifier 100. Upon completion of the process, the utility prompts the user to provide a name and storage location to save the correction data. As a result, the standard Fender® Bassman model can be updated with the correction filters obtained from Brian Setzer's real guitar amplifier 100, or alternatively a new amp model can be generated and stored in the digital modeling system 112. The corrected amp model can then match the sound of Brian Setzer's particular real guitar amplifier 100.

In one or more embodiments, the user can toggle between the real guitar amplifier 100 and the corrected or matched digital amp model while playing a guitar, referred to as an A/B comparison, to verify the results of the amp matching process. In some examples, a refinement stage can be employed wherein a dual FFT equalizer (EQ) match can be performed to correct any final inaccuracies in the output filter due to differences arising due to stochastic differences between the stimulus waveform and a normal stimulus, namely an electric guitar. These differences can arise because the non-linearity 118 is not perfectly stationary in a real guitar amplifier 100. For example, due to power supply impedance, the clip limits of non-linearity 118 can change slightly as the power supply voltage fluctuates. This phenomenon can manifest primarily as changes in the output filter of the amp model. A dual FFT EQ match can be utilized using such a refinement operation to remove this final inaccuracy, if desired.

In some examples, the user can select between several different matching methods as illustrated in FIG. 5. In a first method, matching can be performed between the amp model such as amp model 516 and a combination of a real guitar amplifier 100 plus speaker 510 combination. A microphone 512 can be positioned to obtain the response from the speaker 510 such that the resulting corrected output filter 216 consists primarily of the impulse response of the speaker 510. A microphone preamplifier 514 can be used to amplify the signal from microphone 512. Upon completion of the first method, the user can store this impulse response in a selected location in memory 314 so that this impulse response of speaker 510 can be used at a later date with other amp models.

In a second method, matching can be performed between the amp model 516 and the output voltage at the speaker terminals of the real guitar amplifier 100. For example, a direct-inject (DI) box 522 can be used between the output of the real guitar amplifier 100 and the speaker 510. Alternatively. any other suitable method of reducing the speaker voltage to a line level the matching process can be used to obtain an output filter that does not include the speaker impulse response. In a third method matching can be performed using both the microphone 512 response and the response at the speaker terminal using DI box 522 simultaneously. Such a hybrid technique can allow full separation of the impulse response (IR) of the speaker 510 from the response of the real guitar amplifier 100, allowing the speaker's IR to be saved in memory 314 while also creating a corrective output filter 212 for the amp model 516 to be used to match the amp model 516 to output filter response of the real guitar amplifier.

In further examples, the data obtained by the amp matching or correcting process as discussed herein can be shared among multiple users by uploading and/or downloading data files from/to the digital modeling system. For example, the correction filters or speaker IRs can be obtained and uploaded to a server or the cloud to be downloaded or distributed to other users.

The following are example implementations of the subject matter described herein. In example one, a method to match a digital amplifier model to a real guitar amplifier, comprises obtaining an amplifier output filter and an amplifier input filter for the real guitar amplifier, using the amplifier output filter and a model output filter to obtain a corrective output filter, using the amplifier input filter and a model input filter to obtain a corrective input filter, and applying the corrective input filter and the corrective output filter to the digital amplifier model. In example two, said applying comprises combining the corrective input filter with the model input filter to yield a corrected input filter, combining the corrective output filter with the model output filter to yield a corrected output filter, and replacing the model input filter and the model output filter with the corrected input filter and the corrected output filter in the digital amplifier model. In example three, said obtaining an amplifier output filter and an amplifier input filter for the real guitar amplifier comprises obtaining the amplifier output filter by applying a high-level exponential sine sweep (ESS) at an input of the real guitar amplifier to operate the real guitar amplifier in a non-linear region, capturing a high-level output signal at the output of the real guitar amplifier, and convolving the high-level output signal with a matched filter to obtain the output filter. Said obtaining an amplifier output filter and an amplifier input filter for the real guitar amplifier comprises obtaining the input filter by applying a low-level exponential sine sweep (ESS) at the input of the real guitar amplifier to operate the guitar amplifier in a linear region, capturing a low-level output signal of the real guitar amplifier, and determining the input filter from the output filter and the low-level output signal. In example four, the method further comprises applying the high-level ESS using multiple sweeps and averaging the high-level output signals captured for the multiple sweeps. In example five, each sweep of the multiple sweeps has a unique start frequency and a unique stop frequency. In example six, each sweep of the multiple sweeps has an identical stop frequency to start frequency ratio. In example seven, the method further comprises starting a sweep of the high-level ESS at a lower amplitude in the non-linear region, increasing the amplitude of the high-level ESS for each subsequent sweep, and comparing a result of a subsequent sweep with a result of a previous sweep until a difference in the results is below a threshold value. In example eight, a spectrum of the matched filter rises at 3 decibels per octave. In example nine, a convolution of the ESS and the matched filter comprises an impulse in time domain. In example ten, said convolving is performed using fast Fourier transform (FFT) processing.

In example eleven, an apparatus to match a match a digital amplifier model to a real guitar amplifier comprises a processor and a memory coupled with the processor, wherein the digital amplifier model is stored in the memory. The processor is configured to obtain an amplifier output filter and an amplifier input filter for the real guitar amplifier, determine a corrective output filter using the amplifier output filter and a model output filter, determine a corrective input filter using the amplifier input filter and a model input filter, and apply the corrective input filter and the corrective output filter to the digital amplifier model. In example twelve, the processor is further configured to combine the corrective input filter with the model input filter to yield a corrected input filter, combine the corrective output filter with the model output filter to yield a corrected output filter, and replace the model input filter and the model output filter with the corrected input filter and the corrected output filter in the digital amplifier model. In example thirteen, the processor is further configured to obtain the amplifier output filter by applying a high-level exponential sine sweep (ESS) at an input of the real guitar amplifier to operate the real guitar amplifier in a non-linear region, capturing a high-level output signal at the output of the real guitar amplifier, and convolving the high-level output signal with a matched filter to obtain the output filter. The processor is configured to obtain the input filter by applying a low-level exponential sine sweep (ESS) at the input of the real guitar amplifier to operate the guitar amplifier in a linear region, capturing a low-level output signal of the real guitar amplifier, and determining the input filter from the output filter and the low-level output signal. In example fourteen, the processor is further configured to apply the high-level ESS using multiple sweeps and average the high-level output signals captured for the multiple sweeps. In example fifteen, each sweep of the multiple sweeps has a unique start frequency and a unique stop frequency. In example sixteen, each sweep of the multiple sweeps has an identical stop frequency to start frequency ratio. In example seventeen, the processor is further configured to start a sweep of the high-level ESS at a lower amplitude in the non-linear region, increase the amplitude of the high-level ESS for each subsequent sweep, and compare a result of a subsequent sweep with a result of a previous sweep until a difference in the results is below a threshold value. In example eighteen, a spectrum of the matched filter rises at 3 decibels per octave. In example nineteen, a convolution of the ESS and the matched filter comprises an impulse in time domain. In example twenty, said convolving is performed using fast Fourier transform (FFT) processing. In example twenty-one, non-transitory machine-readable medium has instructions stored thereon to match a digital amplifier model to a real guitar amplifier that, when executed, result in obtaining an amplifier output filter and an amplifier input filter for the real guitar amplifier, using the amplifier output filter and a model output filter to obtain a corrective output filter, using the amplifier input filter and a model input filter to obtain a corrective input filter, and applying the corrective input filter and the corrective output filter to the digital amplifier model. In example twenty-two, the instructions, when executed, further result in combining the corrective input filter with the model input filter to yield a corrected input filter, combining the corrective output filter with the model output filter to yield a corrected output filter, and replacing the model input filter and the model output filter with the corrected input filter and the corrected output filter in the digital amplifier model. In example twenty-three, said obtaining an amplifier output filter and an amplifier input filter for the real guitar amplifier comprises obtaining the amplifier output filter by applying a high-level exponential sine sweep (ESS) at an input of the real guitar amplifier to operate the real guitar amplifier in a non-linear region, capturing a high-level output signal at the output of the real guitar amplifier, and convolving the high-level output signal with a matched filter to obtain the output filter. Said obtaining an amplifier output filter and an amplifier input filter for the real guitar amplifier comprises obtaining the input filter by applying a low-level exponential sine sweep (ESS) at the input of the real guitar amplifier to operate the guitar amplifier in a linear region, capturing a low-level output signal of the real guitar amplifier, and determining the input filter from the output filter and the low-level output signal. In example twenty-four, the instructions, when executed, further result in applying the high-level ESS using multiple sweeps and averaging the high-level output signals captured for the multiple sweeps. In example twenty-five, each sweep of the multiple sweeps has a unique start frequency and a unique stop frequency. In example twenty-six, each sweep of the multiple sweeps has an identical stop frequency to start frequency ratio. In example twenty-seven, the instructions, when executed, further result in starting a sweep of the high-level ESS at a lower amplitude in the non-linear region, increasing the amplitude of the high-level ESS for each subsequent sweep, and comparing a result of a subsequent sweep with a result of a previous sweep until a difference in the results is below a threshold value. In example twenty-eight, a spectrum of the matched filter rises at 3 decibels per octave. In example twenty-nine, a convolution of the ESS and the matched filter comprises an impulse in time domain. In example thirty, said convolving is performed using fast Fourier transform (FFT) processing. In any of the examples herein, classic deconvolution techniques can be used to obtain the output filter and the input filter instead of using a matched filter.

Although the claimed subject matter has been described with a certain degree of particularity, it should be recognized that elements thereof may be altered by persons skilled in the art without departing from the spirit and/or scope of claimed subject matter. It is believed that the subject matter pertaining to amplifier matching in a digital amplifiers modeling system and many of its attendant utilities will be understood by the forgoing description, and it will be apparent that various changes may be made in the form, construction and/or arrangement of the components thereof without departing from the scope and/or spirit of the claimed subject matter or without sacrificing all of its material advantages, the form herein before described being merely an explanatory embodiment thereof, and/or further without providing substantial change thereto. It is the intention of the claims to encompass and/or include such changes.

What is claimed is:
1. A method to match a digital amplifier model to a real guitar amplifier, comprising:
obtaining an amplifier output filter and an amplifier input filter for the real guitar amplifier, wherein:
the amplifier output filter is obtained by applying a high-level exponential sine sweep (ESS) at an input of the real guitar amplifier to operate the real guitar amplifier in a non-linear region by using multiple sweeps and averaging the high-level output signals captured for the multiple sweeps, capturing a high-level output signal at the output of the real guitar amplifier; and convolving the high-level output signal with a matched filter to obtain the output filter; and the amplifier input filter is obtained by applying a low-level exponential sine sweep (ESS) at the input of the real guitar amplifier to operate the guitar amplifier in a linear region, capturing a low-level output signal of the real guitar amplifier, and determining the input filter from the output filter and the low-level output signal;

using the amplifier output filter and a model output filter to obtain a corrective output filter;

using the amplifier input filter and a model input filter to obtain a corrective input filter; and applying the corrective input filter and the corrective output filter to the digital amplifier model.

2. The method of claim 1, wherein said applying comprises:

combining the corrective input filter with the model input filter to yield a corrected input filter;

combining the corrective output filter with the model output filter to yield a corrected output filter; and replacing the model input filter and the model output filter with the corrected input filter and the corrected output filter in the digital amplifier model.

3. The method of claim 1, wherein each sweep of the multiple sweeps has a unique start frequency and a unique stop frequency.

4. The method of claim 1, wherein each sweep of the multiple sweeps has an identical stop frequency to start frequency ratio.

5. The method of claim 1, further comprising:

starting a sweep of the high-level ESS at a lower amplitude in the non-linear region;

increasing the amplitude of the high-level ESS for each subsequent sweep; and comparing a result of a subsequent sweep with a result of a previous sweep until a difference in the results is below a threshold value.

6. The method of claim 1, wherein a spectrum of the matched filter rises at 3 decibels per octave.

7. The method of claim 1, wherein a convolution of the high-level ESS or the low-level ESS and the matched filter comprises an impulse in time domain.

8. The method of claim 1, wherein said convolving is performed using fast Fourier transform (FFT) processing.

9. An apparatus to match a match a digital amplifier model to a real guitar amplifier, comprising:

a processor; and a memory coupled with the processor, wherein the digital amplifier model is stored in the memory;

wherein the processor is configured to:

obtain an amplifier output filter and an amplifier input filter for the real guitar amplifier, wherein:

the amplifier output filter is obtained by applying a high-level exponential sine sweep (ESS) at an input of the real guitar amplifier to operate the real guitar amplifier in a non-linear region by applying the high-level ESS using multiple sweeps and averaging the high-level output signals captured for the multiple sweeps, capturing a high-level output signal at the output of the real guitar amplifier, and convolving the high-level output signal with a matched filter to obtain the output filter; and the input filter is obtained by applying a low-level exponential sine sweep (ESS) at the input of the real guitar amplifier to operate the guitar amplifier in a linear region, capturing a low-level output signal of the real guitar amplifier, and determining the input filter from the output filter and the low-level output signal;

determine a corrective output filter using the amplifier output filter and a model output filter;

determine a corrective input filter using the amplifier input filter and a model input filter; and apply the corrective input filter and the corrective output filter to the digital amplifier model.

10. The apparatus of claim 9, wherein the processor is further configured to:

combine the corrective input filter with the model input filter to yield a corrected input filter;

combine the corrective output filter with the model output filter to yield a corrected output filter; and replace the model input filter and the model output filter with the corrected input filter and the corrected output filter in the digital amplifier model.

11. A non-transitory machine-readable medium having instructions stored thereon to match a digital amplifier model to a real guitar amplifier that, when executed, result in:

obtaining an amplifier output filter and an amplifier input filter for the real guitar amplifier, wherein:

the amplifier output filter is obtained by applying a high-level exponential sine sweep (ESS) at an input of the real guitar amplifier to operate the real guitar amplifier in a non-linear region by applying the high-level ESS using multiple sweeps and averaging the high-level output signals captured for the multiple sweeps, capturing a high-level output signal at the output of the real guitar amplifier, and convolving the high-level output signal with a matched filter to obtain the output filter; and the amplifier input filter is obtained by applying a low-level exponential sine sweep (ESS) at the input of the real guitar amplifier to operate the guitar amplifier in a linear region, capturing a low-level output signal of the real guitar amplifier; and determining the input filter from the output filter and the low-level output signal;

using the amplifier output filter and a model output filter to obtain a corrective output filter;

using the amplifier input filter and a model input filter to obtain a corrective input filter; and applying the corrective input filter and the corrective output filter to the digital amplifier model.

12. The non-transitory machine-readable medium of claim 11, wherein the instructions, when executed, further result in:

combining the corrective input filter with the model input filter to yield a corrected input filter;

combining the corrective output filter with the model output filter to yield a corrected output filter; and replacing the model input filter and the model output filter with the corrected input filter and the corrected output filter in the digital amplifier model.

13. The non-transitory machine-readable medium of claim 11, wherein each sweep of the multiple sweeps has a unique start frequency and a unique stop frequency.

14. The non-transitory machine-readable medium of claim 11, wherein each sweep of the multiple sweeps has an identical stop frequency to start frequency ratio.

* * * * *